(12) United States Patent
Jeon (10) Patent No.: US 10,049,730 B2
(45) Date of Patent: Aug. 14, 2018

(54) CROSSBAR ARRAYS WITH SHARED DRIVERS

(71) Applicant: Hewlett Packard Enterprise Development LP, Houston, TX (US)

(72) Inventor: Yoocharn Jeon, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/320,817

(22) PCT Filed: Jul. 31, 2014

(86) PCT No.: PCT/US2014/049006
§ 371 (c)(1),
(2) Date: Dec. 21, 2016

(87) PCT Pub. No.: WO2016/018328
PCT Pub. Date: Feb. 4, 2016

(65) Prior Publication Data
US 2017/0206959 A1 Jul. 20, 2017

(51) Int. Cl.
*G11C 5/06* (2006.01)
*G11C 13/00* (2006.01)

(52) U.S. Cl.
CPC ...... *G11C 13/0028* (2013.01); *G11C 13/0026* (2013.01)

(58) Field of Classification Search
CPC ......... H01L 27/14603; H01L 27/14621; H01L 27/14627; G11C 5/025; G11C 7/12; G11C 8/08; G11C 8/10
USPC ..... 345/87, 76, 82, 100, 103, 178, 204, 211, 345/212, 213, 55, 690, 77, 90, 94, 98, 99, 345/E3.018, 308
See application file for complete search history.

(56) References Cited

U.S. PATENT DOCUMENTS

| | | |
|---|---|---|
| 6,356,477 B1 | 3/2002 | Tran |
| 7,289,372 B1 | 10/2007 | Yu et al. |
| 8,305,788 B2 | 11/2012 | Matsui et al. |
| 8,565,003 B2 | 10/2013 | Siau |

(Continued)

FOREIGN PATENT DOCUMENTS

GB 2239540 A 7/1991

OTHER PUBLICATIONS

International Searching Authority, The International Search Report and the Written Opinion, PCT/US2014/049006, dated Feb. 24, 2015, 11 Pages.

(Continued)

*Primary Examiner* — Thong Q Le
(74) *Attorney, Agent, or Firm* — Hewlett Packard Enterprise Patent Department (57) ABSTRACT

A crossbar array with shared drivers has a plurality of sets of row lines, a set of row drivers, a plurality of sets of column lines, a set of column drivers, and a plurality of memory cells. Each set of row lines has a plurality of row lines and is driven by a set of row drivers. Furthermore, each set of row lines intersects with a plurality of the sets of column lines. Likewise, each set of column lines has a plurality of column lines and is driven by a set of column drivers. Each set of column lines intersects with a plurality of the sets of row lines. Each memory cell is coupled between an intersection of a row line and a column line.

19 Claims, 4 Drawing Sheets

(56) References Cited

U.S. PATENT DOCUMENTS

| | | |
|---|---|---|
| 8,625,322 B2 | 1/2014 | Samachisa et al. |
| 2002/0122030 A1* | 9/2002 | Stiens .................. G09G 3/3674 345/178 |
| 2004/0233709 A1 | 11/2004 | Tsuchida et al. |
| 2006/0221758 A1 | 10/2006 | Petti et al. |
| 2011/0007548 A1 | 1/2011 | Jung et al. |
| 2013/0010521 A1 | 1/2013 | Carter |
| 2013/0100726 A1* | 4/2013 | Yi ....................... G11C 11/5685 365/148 |
| 2015/0325289 A1* | 11/2015 | Castro ................ G11C 13/0004 365/148 |

OTHER PUBLICATIONS

Zidan, M.A. et al., Memristor-based Memory: the Sneak Paths Problem and Solutions, preprint submitted to Microelectronics Journal, Oct. 29, 2012, pp. 1-9.

* cited by examiner

CROSSBAR ARRAYS WITH SHARED DRIVERS

BACKGROUND

For individually-accessible memory elements, crossbar array arrangements are optimal for achieving high density. Memory crossbar arrays may include a memristor or other nonvolatile memory device. Memristors are devices that can be programmed to different resistive states by applying a programming energy, such as a voltage. After programming, the state of the memristor can be read and remains stable over a specified time period. Thus, memristors can be used to store digital data. For example, a high resistance state can represent a digital "0", and a low resistance state can represent a digital "1." Large crossbar arrays of memristive elements can be used in a variety of applications, including random access memory, non-volatile solid state memory, programmable logic, signal processing control systems, pattern recognition, and other applications.

BRIEF DESCRIPTION OF THE DRAWINGS

The following detailed description references the drawings, wherein.

DETAILED DESCRIPTION

As mentioned above, memristors are devices that may be used as components in a wide range of electronic circuits, such as nonvolatile memories, switches, radio frequency circuits, and logic circuits and systems. In a memory structure, a crossbar array of memristors or memristive devices may be used. When used as a basis for memories, memristors may be used to store bits of information, 1 or 0. The resistance of a memristor may be changed by applying an electrical stimulus, such as a voltage or a current, through the memristor. Generally, at least one channel may be formed that is capable of being switched between two or more states. For example, in one state the channel forms an electrically conductive path ("ON"), and in another state the channel forms a less conductive path ("OFF"). In some other cases, conductive paths represent "OFF" and less conductive paths represent "ON". Conducting channels may be formed by ions and/or vacancies.

In a memory crossbar array, memory cells are arranged at the intersections of row lines and column lines. Drivers, which are typically transistor circuits, are generally used to operate the crossbar array by applying voltage or current to the lines of the crossbar array in order to address the memory cells. Array density of the memory cells is dependent on the patterning resolution of the crossbar array, but the size of the transistor drivers may be larger than the minimum size of the crossbar array. Under prevailing circuit designs, drivers are generally placed under the crossbar array on a chip because the crossbar array does not require any active circuits. However, because the number of drivers needed to operate a crossbar array increases linearly with the number of row lines and column lines and because the number of memory cells in a crossbar array increases quadratically, the area required for the drivers may limit the density of the crossbar or limit the ability to have smaller arrays. Large arrays present various challenges, including increased wire resistance of the lines of the array, high operating currents, and unwanted sneak currents. These challenges may affect the efficiency and effectiveness of using memory cells in crossbar arrays.

Examples disclosed herein provide for memory crossbars with shared drivers. In example implementations, a memory device has a crossbar array, which includes a plurality of sets of row lines, a plurality of sets of column lines, and a plurality of memory cells. Each set of row lines is driven by a set of row drivers, and each set of column lines is driven by a set of column drivers. As described in detail below, each set of row lines intersects with a plurality of sets of column lines, and each set of column lines intersects with a plurality of sets of row lines. Each memory cell is coupled at an intersection of a row line and a column line. Because the set of row lines driven by a set of row drivers intersects with multiple sets of column lines, a particular set of row drivers can address column lines of multiple sets of column lines that intersect with the set of row lines driven by the particular set of row drivers. By sharing sets of row drivers between multiple sets of column lines and sharing sets of column drivers between multiple sets of row lines, fewer total drivers are required to operate a crossbar array. Accordingly, memory crossbars with shared drivers may achieve a desired array density and size.

Figure 1A:
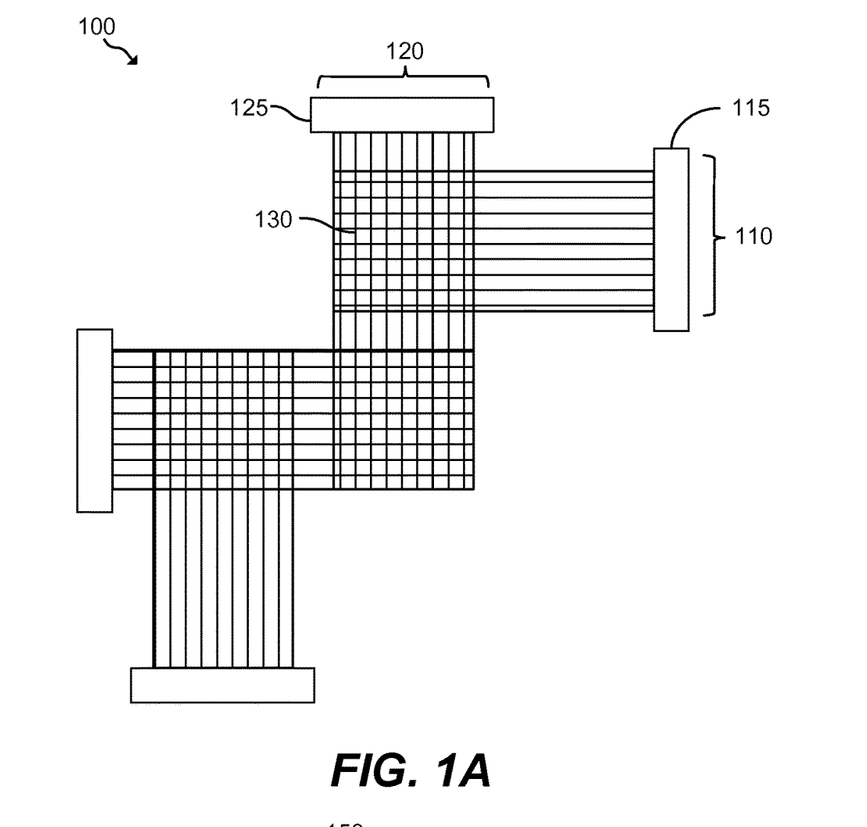
FIG. 1A is a diagram of an example crossbar array having shared row drivers and shared column drivers.

Referring now to the figures, FIG. 1A depicts an example crossbar array 100 having shared row drivers and shared column drivers. Crossbar array 100 may have a plurality of sets of row lines 110, where each set of row lines 110 includes a plurality of row lines and where each set of row lines 110 is driven by a set of row drivers 115. Crossbar array 100 may also have a plurality of sets of column lines 120, where each set of column lines 120 includes a plurality of column lines and where each set of column lines 120 is driven by a set of column drivers 125. Each set of row lines 110 may intersect with a plurality of the sets of column lines 120, and each set of column lines 120 may intersect with a plurality of the sets of row lines 110. Furthermore, crossbar array 100 may have a plurality of memory cells 130 where each memory cell 130 is coupled at an intersection of a row line of one set of row lines 110 and a column line of one of the sets of column lines 120.

A set of row lines 110 may include multiple row lines aligned in parallel to form a set. A row line may be an electrode that connects memory cells of a crossbar along one axis and carry an electrical stimulus to and from memory cells. A row line may sometimes be referred to as a bit line. Depending on orientation, a row line may alternatively be referred to as a word line. Similarly, a set of column lines 120 may include multiple column lines aligned in parallel to form a set. Sets of column lines 120 may run perpendicular to a set of row lines 110 along another axis, to connect memory cells to complete the crossbar array. A column line may also be an electrode that carries electrical stimulus to and from memory cells of the crossbar array. Depending on orientation, a column line may be referred to as a word line or bit line. Row lines and column lines may include a number of materials, such as platinum (Pt), tantalum (Ta), hafnium (Hf), zirconium (Zr), aluminum (Al), cobalt (Co), nickel (Ni), iron (Fe), niobium (Nb), molybdenum (Mo), tungsten (W), copper (Cu), titanium (Ti), tantalum nitrides (TaN$_x$), or titanium nitrides (TiN$_x$).

Each set of row lines 110 may be driven by a set of row drivers 115. In some examples, each row line of a particular set of row lines 110 may be driven by a row driver of the set of row drivers 115. For example, each row line may be driven by a separate row driver. A driver may be a transistor or other circuit or device that controls the application of an electrical stimulus to the line to which it is connected. Analogously, each set of column lines 120 may be driven by a set of column drivers 125. Each column line may be driven by a separate column driver. The placement of set of row drivers 115 and set of column drivers 125 on ends of set of row lines 110 and set of column lines 120, respectively, in FIG. 1A is for illustration purposes. For example, set of row drivers 115 and set of column drivers 125 may alternatively be placed under the crossbar array on a chip.

Each set of row lines 110 may intersect with a plurality of sets of column lines 120. As shown in FIG. 1A, each set of row lines 110 intersects with two sets of column lines 120. Similarly, each set of column lines 120 may intersect with a plurality of sets of row lines 110. In FIG. 1A, each set of column lines 120 intersects with two sets of row lines 110. As a result, in the example shown, there are a total of two sets of row lines 110 driven by two sets of row drivers 115 and two sets of column lines 120 driven by two sets of column drivers 125.

A memory cell 130 may be coupled at each intersection of a row line and a column line. Accordingly, a memory cell 130 may be located at each line intersection of crossbar array 100. In some examples, memory cell 130 may include a nonvolatile memory device or component, which may be computer memory that may store and restore information even when not powered. Examples of nonvolatile memory devices may include read-only memory, flash memory, magnetic storage, and other devices. In some examples, including ones described in detail herein, memory cell 130 may include a memristor, which may provide nonvolatile storage.

A memristor may be an electrical device that has a resistance that changes with an applied electrical stimulus across or through the memristor. Furthermore, a memristor may "memorize" its last resistance. In this manner, a memristor may be set to at least two states to operate as a memory cell 130 in crossbar array 100. Memristors may be based on a variety of materials. Memristors may be oxide-based, meaning that at least a portion of a memristor is formed from an oxide-containing material. Memristors may also be nitride-based, meaning that at least a portion of a memristor is formed from a nitride-containing composition. Furthermore, memristors may be oxy-nitride based, meaning that a portion of a memristor is formed from an oxide-containing material and that a portion of a memristor is formed from a nitride-containing material. In some examples, memristors may be formed based on tantalum oxide (TaO$_x$) or hafnium oxide (HfO$_x$) compositions. Other example memristor materials may include titanium oxide, yttrium oxide, niobium oxide, zirconium oxide, aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, and silicon nitride. In addition, other functioning memristors may be employed in the practice of the teachings herein. For example, a memristor may have multiple layers that include electrodes and dielectric materials.

In some examples, memory cell 130 may also include a selector. Selectors may be electrical components placed in series with other components—such as memristors or other memory devices—that controls the overall electrical properties of resulting combination devices. In many examples, a selector coupled to a memristor may have current-voltage nonlinearity. For example, when an applied voltage across a selector is increased, the current passing through the selector changes by an amount greater than the proportional increase in voltage. The selector of memory cell 130 may be a variety of different types of selectors, including crested tunnel barrier selectors and negative differential resistance selectors. In some examples, a selector may have an oxide-based active region.

Furthermore, crossbar array 100 may include a memory controller to apply an electrical stimulus to a target row line and to a target column line to address a target memory cell 130. A memory controller may be an electrical device or component that, in addition to other functions, operates or controls memory devices. For crossbar array 100, a memory controller may control the sets of drivers to apply electrical stimulus in order to address memory cells 130. Because each memory cell 130 is connected to a row line which is driven by a row driver and to a column line driven by a column driver, each memory cell 130 in crossbar array 100 may be addressed by the memory controller. The implementation of a memory controller may include hardware-based components, such as a microchip, chipset, or electronic circuit, and software-driven components, such as a processor, microprocessor, or some other programmable device.

Figure 1B:
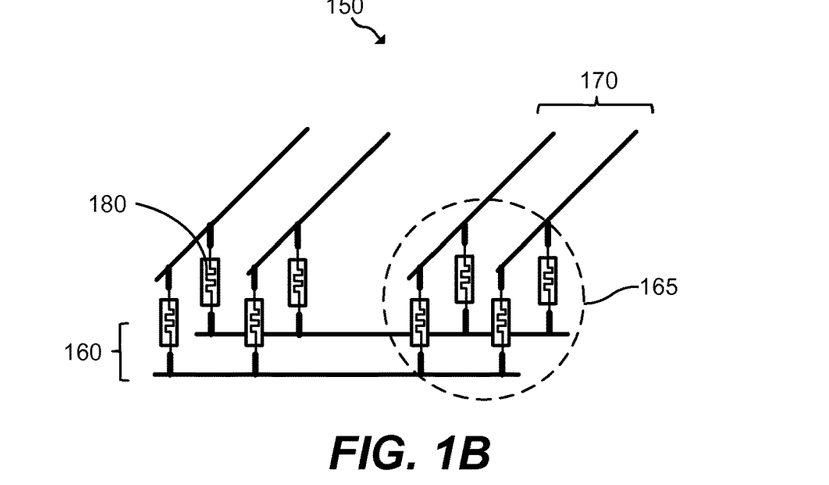
FIG. 1B is diagram of an example crossbar array emphasizing sets of interconnected lines.

FIG. 1B depicts an example crossbar array 150 emphasizing sets of interconnected lines 165. In crossbar 150, a set of row lines 160 may intersection with a set of column lines 170 to form a set of interconnected lines 165. Memory cells 180 may form the connection between row lines and column lines to form the interconnected lines. As shown in FIG. 1B, the number of memory cells 180 formed by set of interconnected lines 165 may equal the product of the number of row lines in set of row lines 160 and of the number of column lines in set of column lines 170.

Memory cell 180 may include a nonvolatile memory device, such as a memristor. Various memristors may be suitable for use as memory cell 180. Furthermore, memory cell 180 may include a selector to increase nonlinearity of memory cell 180. In order to address a particular memory cell 180, a memory controller may control the row driver and column driver connected to the particular memory cell 180 in order to drive an electrical stimulus through the particular memory cell 180 via the row line and the column line.

Figure 2:
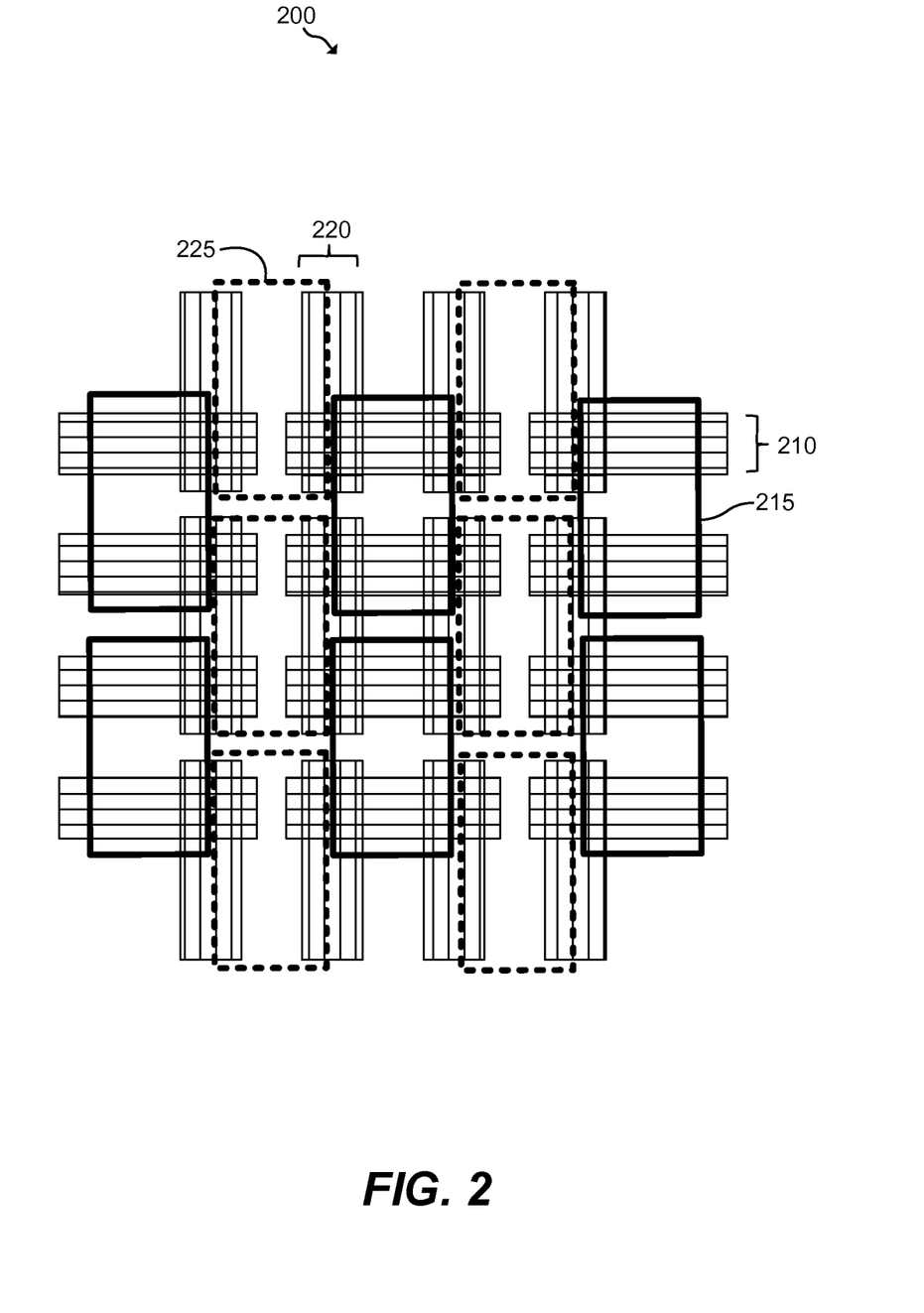
FIG. 2 is a diagram of an example crossbar array having a plurality of shared sets of row drivers and a plurality of shared sets of column drivers.

FIG. 2 depicts an example crossbar array 200 having a plurality of sets of row lines 210, a plurality of sets of column lines 220, a plurality of shared sets of row drivers 215, and a plurality of shared sets of column drivers 225. In crossbar array 200, each two sets of row lines 210 may be driven by a shared set of row drivers 215. Each two sets of column lines 220 may be driven by a shared set of columns driver 225. Each set of row lines 210 may intersect with two sets of column lines 220 that are driven by two separate sets of column drivers 225. On the flipside, each set of column lines 220 may intersect with two sets of row lines 210 that are driven by two separate sets of row drivers 215. Accordingly, using this design layout to expand crossbar array 200, an average of one set of row drivers 215 and one set of column drivers 225 may address two sets of row lines 210 and two sets of column lines 220.

Similarly to crossbar array 100 of FIG. 1A, a memory cell may be coupled at the intersections of each row line and each column line. A memory cell may include a nonvolatile memory device, such as a memrisior. Various memristors may be suitable for use as memory cells. Furthermore, a memory cell may include a selector to increase nonlinearity and to control the current-voltage properties of the memory cell. In order to address a particular memory cell, a memory controller may control the row driver and column driver connected to the particular memory cell in order to drive an electrical stimulus through the particular memory cell via the row line and the column line.

Figure 3:
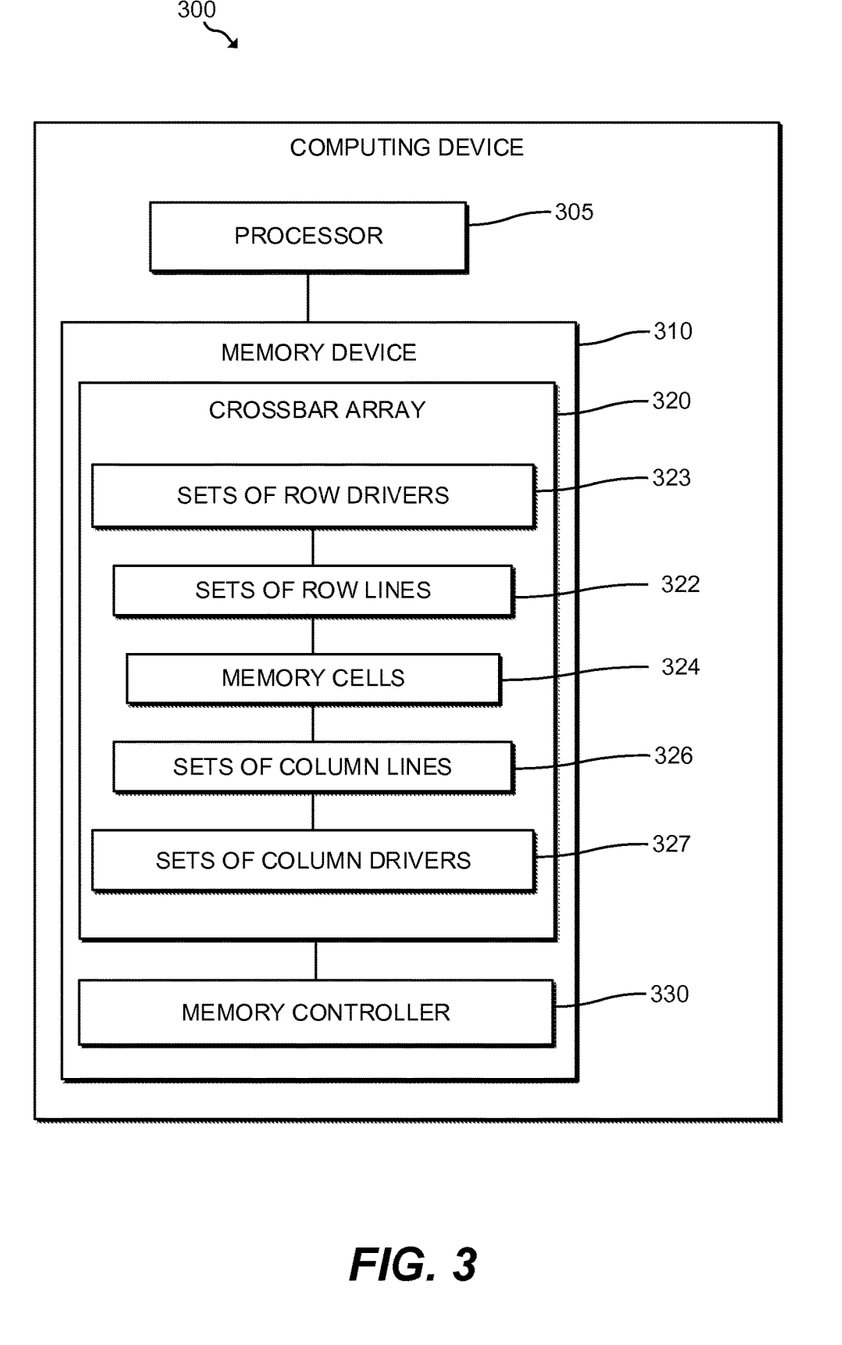
FIG. 3 is a block diagram of an example computing device having a memory device with a crossbar array.

FIG. 3 depicts an example computing device 300 having a memory device 310 with a crossbar array 320. Computing device 300 may be, for example, a notebook or desktop computer, a mobile device, a local area network (LAN) server, a web server, a cloud-hosted server, or any other electronic device that may utilize a memory device or other component having a crossbar array. In the implementation of FIG. 3, computing device 300 includes a processor 310.

Processor 310 may be one or more central processing units (CPUs), semiconductor-based microprocessors, and/or other hardware devices suitable for retrieval and execution of instructions stored in a memory device such as random access memory, machine-readable storage medium, or another form of computer data storage. Memory device 310 may have one or more memory cells 324 that may operate as the storage elements of the memory device. The switching of each memory cell 324 between two states allows the representation of a bit, namely a "0" or "1". Memory cells 324 may form part of a crossbar array 320. A large crossbar array 320 with a large number of memory cells 324 may form the basis of memory device 310, which may be a nonvolatile memory device, random access memory, or other types of memories.

Crossbar array 320 may have a plurality of sets of row lines 322, where each set of row lines 322 is driven by a set of row drivers 323, and a plurality of sets of column lines 326, where each set of column lines 326 is driven by a set of column drivers 327. Each set of row lines 322 may intersect with a plurality of the sets of column lines 326, and each set of column lines 326 may intersect with a plurality of the sets of row lines 322. Furthermore, crossbar array 320 may have a plurality of memory cells 324 where each memory cell 324 is coupled between an intersection of a row line of one set of row lines 322 and a column line of one set of column lines 326.

In one example, each two sets of row lines 322 may be driven by a shared set, of row drivers 323. Each two sets of column lines 326 may be driven by a shared set of columns driver 327. Each set of row lines 322 may intersect with two sets of column lines 326 that are driven by two separate sets of column drivers 327. On the flipside, each set of column lines 326 may intersect with two sets of row lines 322 that are driven by two separate sets of row drivers 323. Memory cell 324 may include a nonvolatile memory device, such as a memristor. Furthermore, memory cell 324 may include a selector to increase nonlinearity and to control the current-voltage properties of memory cell 324.

In order to address each memory cell 324 in crossbar array 320, memory device 310 may have a memory controller 330 that controls the sets of row drivers 322 and the sets of column drivers 326. Memory controller 330 may control the row driver and column driver connected to the particular memory 324 cell in order to drive an electrical stimulus through the particular memory cell 324 via the row line and the column line.

Figure 4:
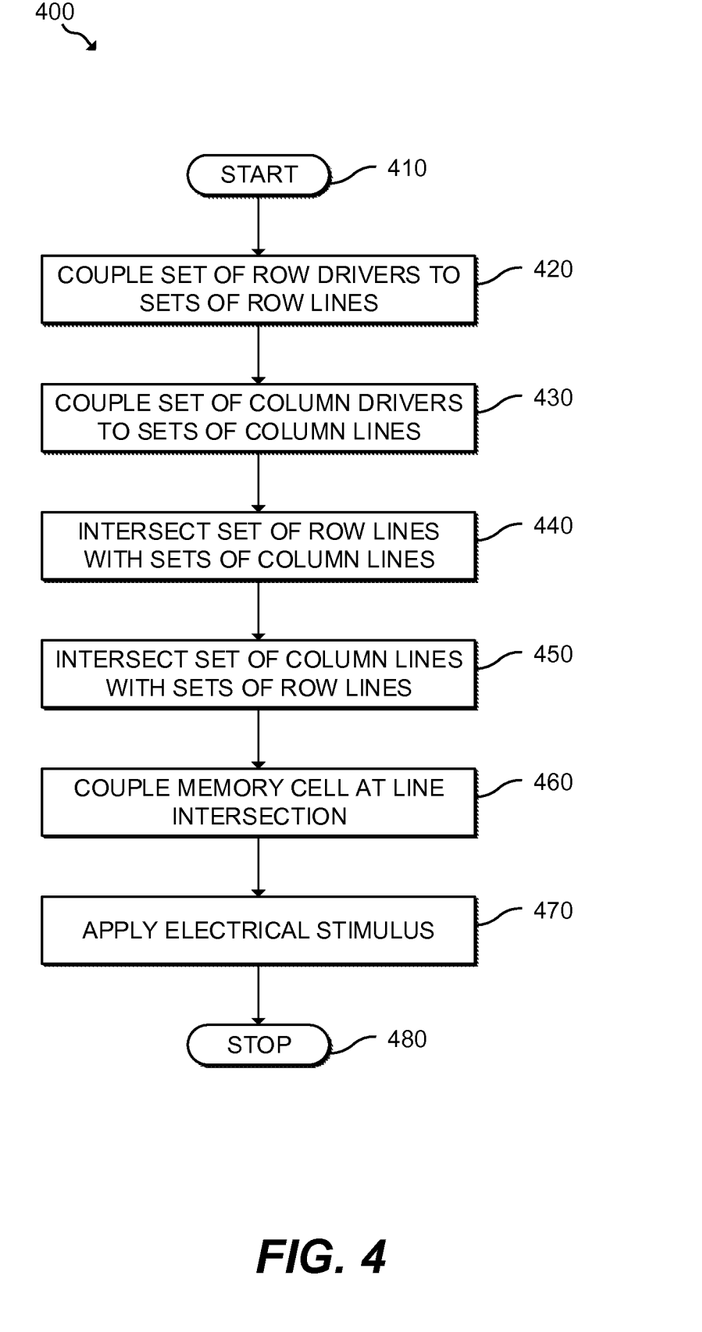
FIG. 4 is a flowchart of an example method according to an example.

FIG. 4 depicts an example method 400, which includes block 420 for coupling a set of row drivers to at least one set of row lines, block 430 for coupling a set of column drivers to at least one set of column lines, block 440 for intersecting one set of row lines with a plurality of sets of column lines, block 450 for intersecting one set of column lines with a plurality of sets of row lines, block 460 for coupling a memory cell between an intersection of a row line and a column line, and block 470 for applying an electrical stimulus to a target row line and to a target column line to address a target memory cell. Although execution of method 400 is herein described in reference to crossbar array 100 of FIG. 1A, other suitable parties for implementation of method 400 should be apparent, including, but not limited to, crossbar array 200 of FIG. 2.

Method 400 may start in block 410 and proceed to block 420, where a set of row drivers 115 is coupled to at least one set of row lines 110. Coupling may mean forming an electrical connection between set of row drivers 115 and sets of row lines 110. Set of row drivers 115 may control the passage of an electrical stimulus, such as a current, to the sets of row lines 110. Accordingly, set of row drivers 115 may control the operation of crossbar array 100 by controlling the addressing of the memory cells 130. A set of row drivers 115 may be coupled to one or more sets of row lines 110. Although each set of row drivers 115 in crossbar array 100 of FIG. 1 is only coupled to one set of row lines 110, crossbar array 200 of FIG. 2, for example, shows each set of row drivers 115 being coupled to two sets of row lines 110.

After coupling sets of row drivers and sets of row lines, method 400 may proceed to block 430, where a set of column drivers 125 is couple to at least one set of column lines 120. Similar to the operation of block 420 for rows, set of column drivers 115 may control the operation of crossbar array 100 by controlling the passage of electrical stimulus to column lines of each set of column lines 120. A set of column drivers 125 may be coupled to one or more sets of column lines 120. Although each set of column drivers 125 in crossbar array 100 of FIG. 1 is only coupled to one set of column lines 120, crossbar array 200 of FIG. 2, for example, shows each set of column drivers 125 being coupled to two sets of column lines 120.

After coupling sets of column drivers and sets of column lines, method 400 may proceed to block 440, where one set of row lines 110 is intersected with a plurality of sets of column lines 120, where each set of column lines 120 is coupled to a different set of column drivers 125. By placing sets of row lines 110 and sets of column lines 120 in a perpendicular layout with one set on top of the other, row lines and column lines may form intersections at the crossing of the lines. Because a set of row lines 110 driven by a set of row drivers 115 intersects with multiple sets of column lines 120, that particular set of row drivers 115 can effectively address multiple sets of column lines 120.

After intersecting sets of row lines, method 400 may proceed to block 450, where one set of column lines 120 is intersected with a plurality of sets of row lines 110, where each set of row lines 110 is coupled to a different set of row drivers 115. Because a set of column lines 120 driven by a set of column drivers 125 intersects with multiple sets of row lines 110, that particular set of column drivers 125 can effectively address multiple sets of row lines 110. Combined with block 440, the total number of sets of row drivers 115 and sets of column drivers 125 is effectively reduced by sharing the drivers among multiple sets of lines.

After intersecting sets of column lines, method 400 may proceed to block 460, where a memory cell 130 is coupled between an intersection of a row line of one set of row lines 110 and a column line of one set of column lines 120. Accordingly, a memory cell 130 may be located at each line intersection of crossbar array 100. In some examples, memory cell 130 may include a nonvolatile memory device or component, which is computer memory that may store and restore information even when not powered. Examples of nonvolatile memory devices may include read-only memory, flash memory, magnetic storage, and other devices. In some examples, including ones described in detail herein, memory cell 130 may include a memristor, which may provide nonvolatile storage. Furthermore, memory cell 130 may include selectors, which may be electrical components placed in series with other components—such as memristors or other memory devices—that controls the overall electrical properties of resulting combination devices. In many examples, a selector coupled to a memristor may have current-voltage nonlinearity.

After coupling memory cell 130, method 400 may, in some examples, proceed to block 470, where an electrical stimulus is applied to a target row line and to a target column line to address a target memory cell. An electrical stimulus may be applied by a memory controller which may be, in some examples, included in crossbar array 100. An electrical stimulus may be a voltage, current, or some other form of electrical stimulation. In some examples, an electrical stimulus may be applied to a memory cell 130 in order to read its state, for example between "on" and "off". In some examples, in order to target a particular memory cell 130, half of a read voltage may be applied to a row line, and the other half of the read voltage may be applied to the particular column line that is coupled to the particular memory cell 130 being targeted. A half voltage to both the row line and the column line coupled to the targeted memory cell 130 may apply the full read voltage to the targeted memory cell 130.

The foregoing describes a number of examples for crossbar arrays with shared drivers. It should be understood that the crossbar arrays described herein may include additional components and that some of the components described herein may be removed and/or modified without departing from the scope of the crossbar arrays or their applications. It should also be understood that the components depicted in the figures are not drawn to scale and thus, the components may have different relative sizes with respect to each other than as shown in the figures.

What is claimed is:

1. A crossbar array, comprising:
   a plurality of sets of row lines, wherein each set of row lines comprises a plurality of row lines, wherein each set of row lines is driven by a set of row drivers, and wherein each two of the sets of row lines are driven by a shared one of the sets of row drivers;
   a plurality of sets of column lines, wherein each set of column lines comprises a plurality of column lines and each of the column lines intersects with a plurality of the sets of row lines, wherein each of the sets of row lines intersects with a plurality of the sets of column lines, wherein each set of column lines is driven by a set of column drivers, and wherein each two of the sets of column lines are driven by a shared one of the sets of column drivers; and
   a plurality of memory cells, wherein each memory cell is coupled at an intersection of a row line of one of the sets of row lines and a column line of one of the sets of column lines.

2. The crossbar array of claim 1, wherein:
   each of the sets of row lines intersects with two of the sets of column lines, wherein the two sets of column lines are each driven by a separate one of the sets of column drivers;
   and
   each of the sets of column lines intersects with two of the sets of row lines, wherein the two sets of row lines are each driven by a separate one of the sets of row drivers.

3. The crossbar array of claim 1, wherein each memory cell comprises a nonvolatile memory device.

4. The crossbar array of claim 3, wherein each memory cell comprises a memristor.

5. The crossbar array of claim 1, further comprising a memory controller to apply an electrical stimulus to a target row line and to a target column line to address a target memory cell coupled to the target row line and to the target column line.

6. The crossbar array of claim 1, wherein each memory cell includes a memory device.

7. The crossbar array of claim 1, wherein the selector exhibits current-voltage nonlinearity.

8. The crossbar array of claim 6, wherein the memory device and selector are placed in series.

9. The crossbar array of claim 1, wherein each memory cell includes a selector.

10. A computing device, comprising a processor and a memory device with a crossbar array, wherein the crossbar array comprises:
    a plurality of sets of row lines, wherein each set of row lines comprises a plurality of row lines, wherein each set of row lines is driven by a set of row drivers, and wherein each two of the sets of row lines are driven by a shared one of the sets of row drivers;
    a plurality of sets of column lines, wherein each set of column lines comprises a plurality of column lines and each of the column lines intersects with a plurality of the sets of row lines, wherein each of the sets of row lines intersects with a plurality of the sets of column lines, wherein each set of column lines is driven by a set of column lines, and wherein each two of the sets of column lines are driven by a shared one of the sets of column drivers; and
    a plurality of memory cells, wherein each memory cell is coupled at an intersection of a row line of one of the sets of row lines and a column line of one of the sets of column lines.

11. The computing device of claim 10, wherein:
    each of the sets of row lines intersects with two of the sets of column lines, wherein the two sets of column lines are each driven by a separate one of the sets of column drivers;
    and
    each of the sets of column lines intersects with two of the sets of row lines, wherein the two sets of row lines are each driven by a separate one of the sets of row drivers.

12. The computing device of claim 10, wherein each memory cell comprises a nonvolatile memory device.

13. The computing device of claim 12, wherein each memory cell comprises a memristor.

14. The computing device of claim 10, wherein the memory device further comprises a memory controller to apply an electrical stimulus to a target row line and to a target column line to address a target memory cell coupled to the target row line and to the target column line.

15. The computing device of claim 10, wherein each memory cell includes a selector.

16. A method, comprising:
    couple a set of row drivers to at least two sets of row lines;
    couple a set of column drivers to at least two sets of column lines;

intersect one of the sets of row lines with a plurality of the sets of column lines, wherein each two of the sets of column lines are coupled to a different set of column drivers;

intersect one of the sets of column lines with a plurality of the sets of row lines, wherein each two of the sets of row lines are coupled to a different set of row drivers; and coupling a memory cell at an intersection of a row line of one of the sets of row lines and a column line of one of the sets of column lines.

17. The method of claim 16, further comprising applying an electrical stimulus to a target row line and to a target column line to address a target memory cell coupled to the target row line and the target column line.

18. The method of claim 16, wherein each memory cell comprises a memristor.

19. The method of claim 16, wherein each memory cell includes a selector.

* * * * *